United States Patent
Sato et al.

(10) Patent No.: US 6,168,063 B1
(45) Date of Patent: Jan. 2, 2001

(54) ULTRASONIC VIBRATION BONDING MACHINE

(75) Inventors: Shigeru Sato; Seiya Nakai, both of Fukuoka-ken (JP)

(73) Assignee: Ultex Corporation, Tokyo (JP)

( * ) Notice: Under 35 U.S.C. 154(b), the term of this patent shall be extended for 0 days.

(21) Appl. No.: 09/461,112

(22) Filed: Dec. 14, 1999

(30) Foreign Application Priority Data

Jan. 6, 1999 (JP) .................................................. 11-001044

(51) Int. Cl.[7] ............................. B23K 1/06; B23K 1/00; B23K 1/14; B23K 5/00; B23K 37/04
(52) U.S. Cl. ............................ 228/1.1; 228/6.2; 228/8; 228/49.1; 148/558
(58) Field of Search .......................... 228/1.1, 6.2, 8, 228/49.1, 102, 103, 110.1; 72/56; 148/558; 438/613, 26, 51

(56) References Cited

U.S. PATENT DOCUMENTS

| | | | |
|---|---|---|---|
| 3,863,826 | * | 2/1975 | Shoh ........................................ 228/1 |
| 4,254,746 | * | 3/1981 | Chiba et al. ............................. 123/52 |
| 4,667,870 | * | 5/1987 | Acedissian et al. ................... 228/103 |
| 5,170,929 | * | 12/1992 | Long et al. ............................. 228/102 |
| 5,427,301 | * | 6/1995 | Pham et al. ......................... 228/110.1 |
| 5,603,444 | * | 2/1997 | Sato ....................................... 228/1.1 |
| 5,669,545 | * | 9/1997 | Pham et al. ............................ 228/1.1 |
| 5,730,832 | * | 3/1998 | Sato et al. ............................. 156/499 |
| 5,884,831 | | 3/1999 | Sato . | 
| 5,884,833 | * | 3/1999 | Sato et al. ............................... 228/36 |
| 5,931,367 | * | 8/1999 | Sato et al. .............................. 228/1.1 |

\* cited by examiner

*Primary Examiner*—Patrick Ryan
*Assistant Examiner*—Colleen Cooke
(74) *Attorney, Agent, or Firm*—Kanesaka & Takeuchi

(57) ABSTRACT

An ultrasonic vibration bonding machine which can simplify a suction passage structure.

A resonator has a suction passage at the maximum vibration amplitude point where a bonding working portion is provided, the positions of the pads of a circuit board mounted on a mounting unit and the positions of the pads of a semiconductor chip absorbed and adsorbed to the bonding working portion are measured to align the pads accurately, and then the pads are bonded together.

3 Claims, 3 Drawing Sheets

ULTRASONIC VIBRATION BONDING MACHINE

BACKGROUND OF THE INVENTION

1. Field of the Invention

The present invention relates to an ultrasonic vibration bonding machine capable of mounting a semiconductor chip on the surface of a circuit board by ultrasonic vibration.

2. Description of the Prior Art

As disclosed by Japanese Laid-open Patent Application No. 10-22308, the present applicant has proposed an ultrasonic vibration bonding machine which is suitable for mounting a semiconductor chip on the surface of a circuit board by ultrasonic vibration.

Since a passage for absorbing and adsorbing a semiconductor chip is formed from the maximum vibration point to the minimum vibration point of a resonator in the above ultrasonic vibration bonding machine, it takes much labor and time to form the passage.

SUMMARY OF THE INVENTION

It is an object of the present invention to provide an ultrasonic vibration bonding machine which can simplify a suction passage structure.

According to a first aspect of the present invention, there is provided an ultrasonic vibration bonding machine for bonding the metal portions of a first material to the metal portions of a second material by ultrasonic vibration transmitted from a transducer to a resonator in such a manner that the first material is mounted on a mounting unit, the second material is absorbed and adsorbed to the bonding working portion of the resonator supported by an ultrasonic vibration bonding unit separated from the mounting unit and located above the mounting unit at both sides, a measuring unit inserted between the first material and the second material without contact measures the positions of the metal portions provided on the top surface of the first material and the positions of the metal portions provided on the under surface of the second material to drive the mounting unit so that the metal portions of the first material are aligned with the metal portions of the second material, and the resonator falls to bond the metal portions of the first material to the metal portions of the second material under pressure, wherein the resonator has a suction passage for absorbing and adsorbing the second material at the maximum vibration amplitude point where the bonding working portion is provided.

According to a second aspect of the present invention, there is provided an ultrasonic vibration bonding machine, wherein the suction passage and a suction hose connected to the suction passage are made separate units which can be connected and disconnected.

According to a third aspect of the present invention, there is provided an ultrasonic vibration bonding machine, where in the resonator has heaters at the minimum vibration amplitude points.

The above and other objects, features and advantages of the invention will become more apparent from the following description when taken in conjunction with the accompanying drawings.

BRIEF DESCRIPTION OF THE ACCOMPANYING DRAWINGS

DETAILED DESCRIPTION OF THE PREFERRED EMBODIMENTS

Figure 1:
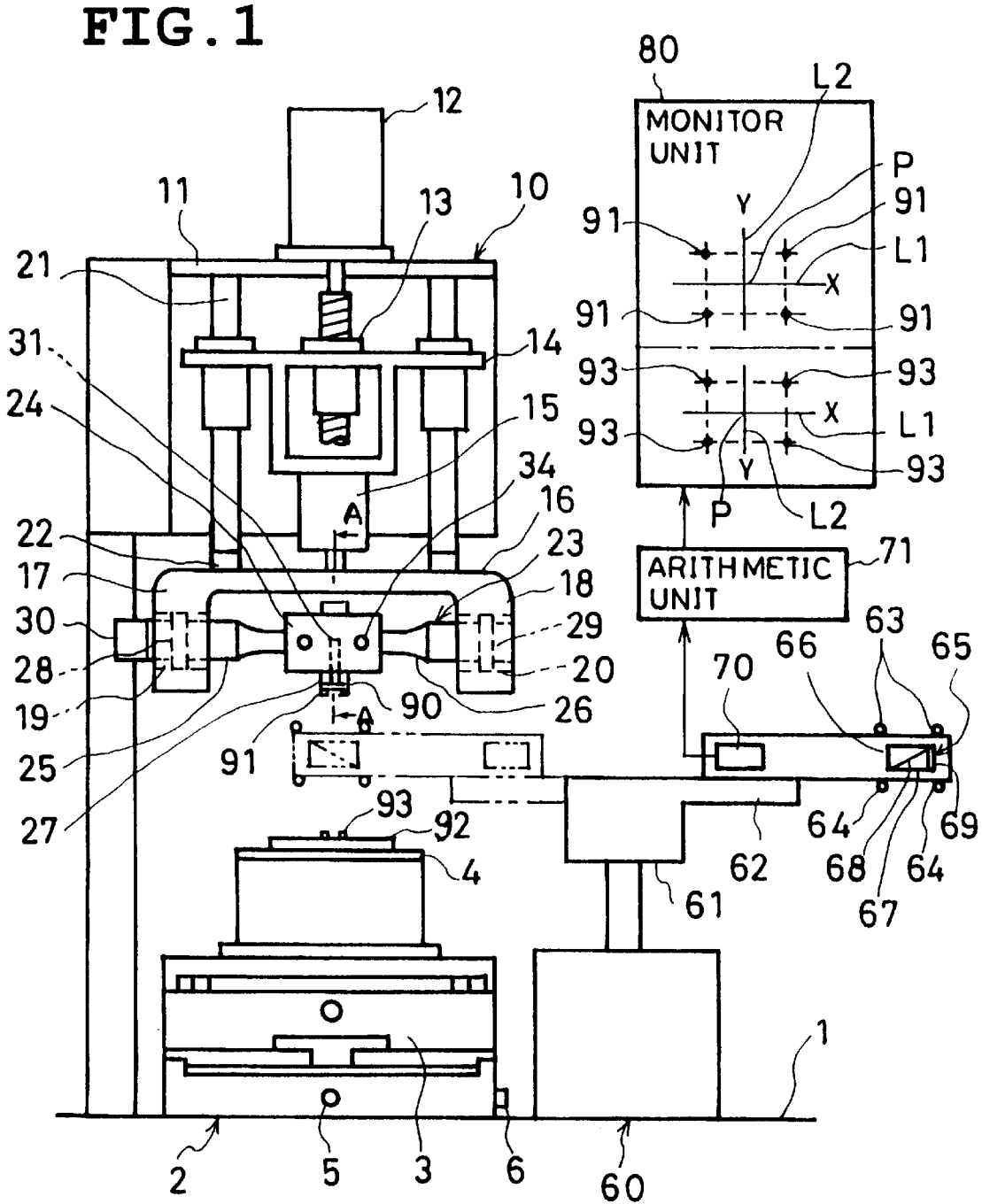
FIG. 1 is a side view of an ultrasonic vibration bonding machine according to Embodiment 1 of the present invention.
Figure 2:
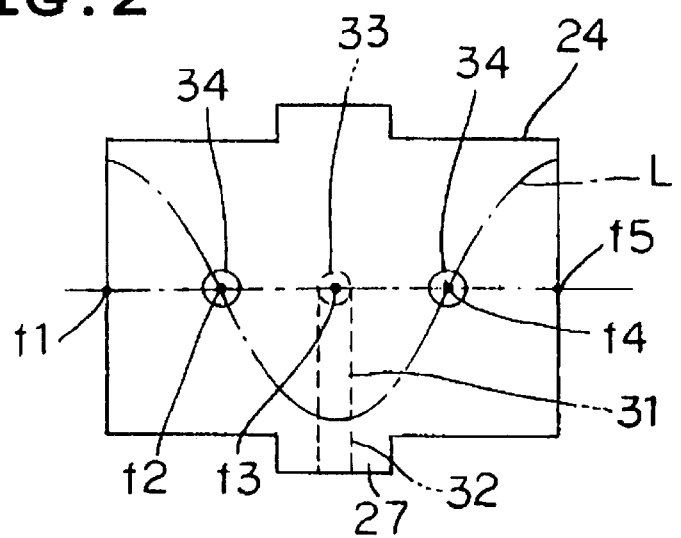
FIG. 2 is a top view of a horn of Embodiment 1.
Figure 3:
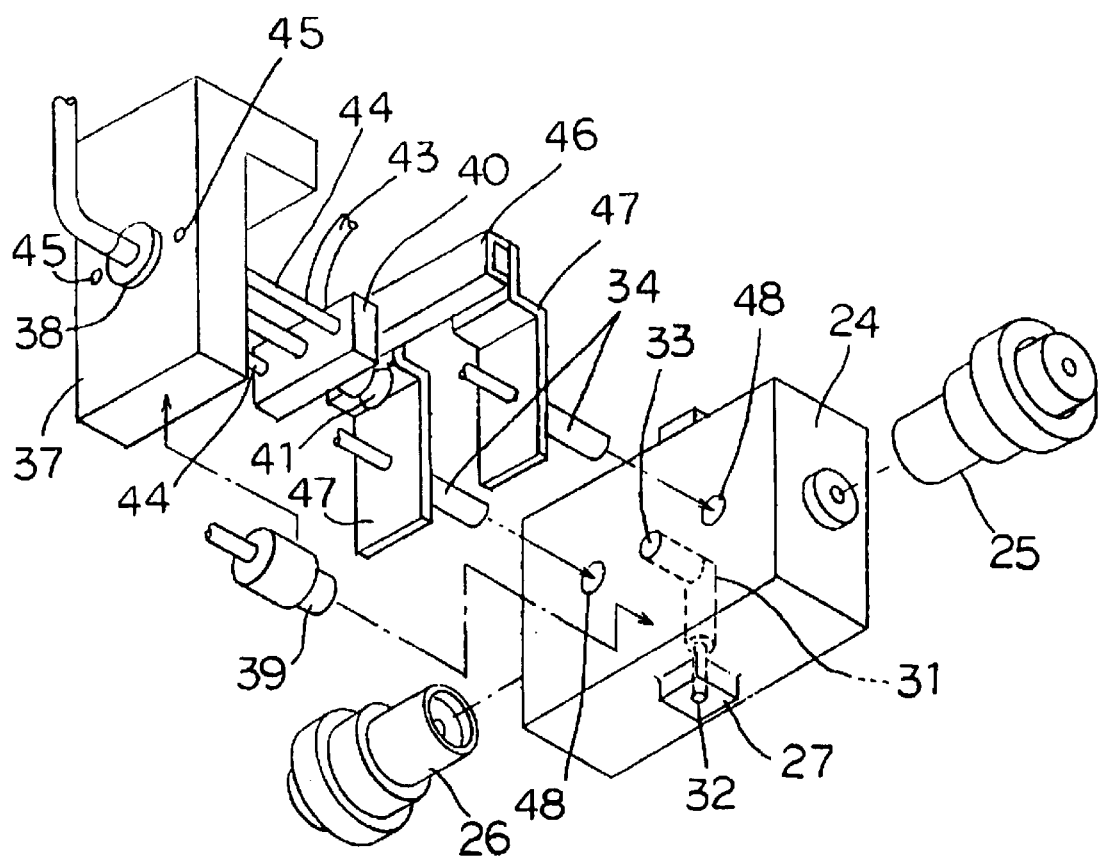
FIG. 3 is a exploded perspective view of an absorbing and adsorbing portion of Embodiment 1.
Figure 4:
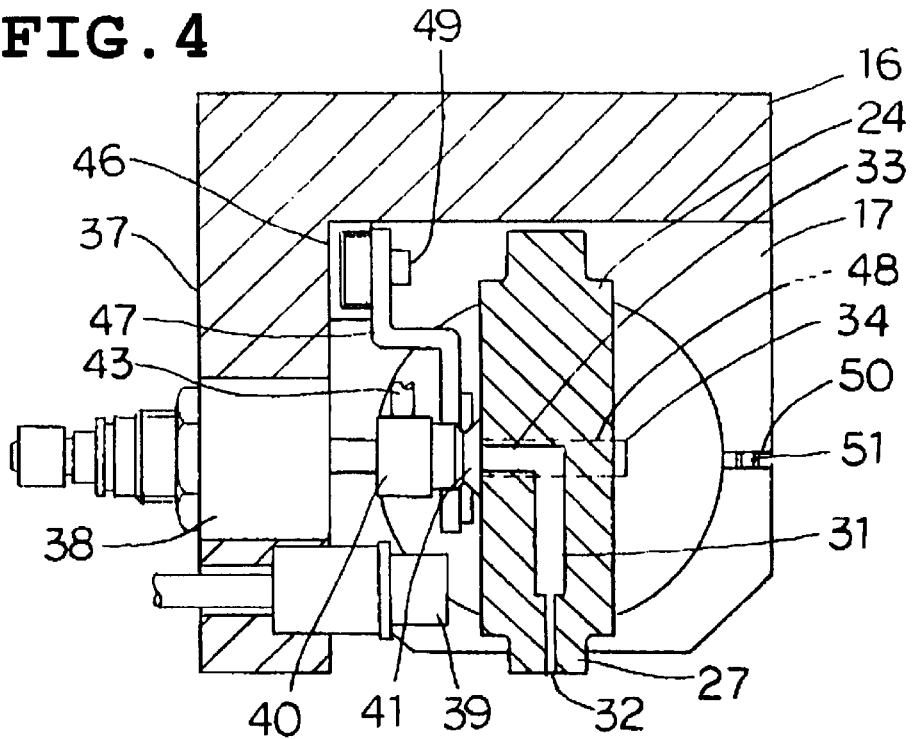
FIG. 4 is a sectional view cut on line A—A of FIG. 1.

FIGS. 1 to 3 show an ultrasonic vibration bonding machine according to Embodiment 1 of the present invention. FIG. 1 is a plan view of the ultrasonic vibration bonding machine, FIG. 2 is an exploded view of the appearance of the absorbing and adsorbing portion of a resonator 23, FIG. 3 is a front view of a horn 24 and FIG. 4 is a sectional view cut on line A—A of FIG. 1.

The ultrasonic vibration bonding machine for mounting a semiconductor chip 90 which is a second material on the surface of a circuit board 92 which is a first material according to Embodiment 1 of the present invention will be described hereinunder with reference to FIG. 1. The semiconductor chip 90 has a plurality of pads 91 which are formed flat or spherical as connection terminals on one side. The circuit board 92 has a plurality of pads 93 which are formed flat or spherical as connection terminals at a chip mounting position on one side. The chip side pads 91 and the substrate side pads 93 correspond to each other in number and position. The semiconductor chip 90 is mounted on the surface of the circuit board 92 by bonding the chip side pads 91 to the substrate side pads 93.

The ultrasonic vibration bonding machine has a mounting unit 2, an ultrasonic vibration bonding unit 10, a measuring unit 60 and a monitor unit 80 on an installation base 1. The mounting unit 2 has an XYθ drive unit 3 and a mount table 4 installed on the XYθ drive unit 3. Based on the output of the measuring unit 60, the XYθ drive unit 3 moves the mount table 4 in X and Y directions which are the lengthwise and widthwise directions of a plane parallel to the installation base 1 and turns the mount table 4 in a θ direction which is a rotation angle on a plane parallel to the installation base 1 with a certain point on the plane as a center to control the position of the mount table 4 so that the chip mounting position of the circuit board 92 which is mounted on the top surface of the mount table 4 parallel to the installation base 1 should be located at a predetermined mounting position. The XYθ drive unit 3 has an X direction elevation angle control unit 5 with respect to the installation base 1 and a Y direction elevation angle control unit 6 with respect to the installation base 1. When it is unknown whether parallelism between the top surface of the mount table 4 and the under surface of the bonding working portion 27 of the resonator 23 is retained like when mounting preparations are made, the resonator 23 is exchanged, or the mount table 4 is exchanged, the X direction elevation angle control unit 5 and the Y direction elevation angle control unit 6 manually control the elevation angle in the X direction of the XYθ drive unit 3 with respect to the installation base 1 and the elevation angle in the Y direction of the XYθ drive unit 3 with respect to the installation base 1 to ensure parallelism between the top surface of the mount table 4 and the under surface of the bonding working portion 27.

The ultrasonic vibration bonding unit 10 comprises a fixed base 11 installed on the installation base 1, a motor 12 such as a servo motor installed on the fixed base 11, a bolt-nut unit connected to the output shaft of the motor 12, a lift base 14 in which the nut of the bolt-nut unit 13 is formed, an air cylinder 15 attached to the lift base 14, a holder 16 connected to the piston rod of the air cylinder 15, a resonator 23 fitted in the holder 16, and a transducer 30 connected coaxial to one end of the resonator 23 by an unshown headless screw and a threaded hole. When the motor 12 runs in a normal direction, the screw rod of the bolt-nut unit 13 turns in a normal direction, and the lift base 14 falls by the nut mated with the screw rod. When the motor 12 runs in a reverse direction, the screw rod of the bolt-nut unit 13 turns in a reverse direction, and the lift base 14 rises by the nut. The lift base 14 moves vertically in such a manner that its rotation is prevented by right and left guide poles 21 extending downward from the fixed base 11. The lower end of a guide shaft 22 stored in the inside of each of the guide poles 21 such that it can move vertically is connected to the holder 16 and moves vertically by the vertical movement of the lift base 14 and the expansion and contraction of the air cylinder 15 to keep the holder 16 parallel to the installation base 1.

The resonator 23 comprises a horn 24 and two boosters 25 and 26 connected coaxial to both sides of the horn 24 by unshown headless screws and threaded holes, and the boosters 25 and 26 are supported by arm portions 17 and 18 extending downward from the left and right sides of the holder 16 so that the resonator 23 is supported by the holder at both sides. The booster 25 is connected coaxial to the transducer 30 by an unshown headless screw and a threaded hole. The transducer 30 is an energy converter such as a piezoelectric element or magnetorestrictive element for converting into mechanical energy electric energy for outputting and generating vertical ultrasonic vibration having a predetermined frequency with power supplied from an unshown ultrasonic generator.

In this embodiment, the horn 24 is as long as the wavelength of a resonance frequency 1 at which it resonates with ultrasonic vibration from the transducer 30 and the boosters 25 and 26 are as long as half the wavelength of the resonance frequency at which they resonate with ultrasonic vibration from the transducer 30. The boosters 25 and 26 are cylindrical and have annular support portions 28 and 29 projecting from the outer surface at the center minimum vibration amplitude point, respectively. The support portions 28 and 29 are stored in through holes 19 and 20 formed coaxial in the left and right arm portions 17 and 18 of the holder 16, respectively, and portions divided by slits 50 (see FIG. 4) formed from the outer surfaces of the arm portions 17 and 18 to the through holes 19 and 20 are fastened by bolts 51 (see FIG. 4) so that the arm portions 17 and 18 hold the support portions 18 and 29, respectively.

As shown in FIG. 2, the horn 24 is shaped like a square plate and has square pole-like bonding working portions 27 projecting outward from the upper and lower surfaces at the center maximum vibration amplitude point f3 and a passage 31 which is an absorbing and adsorbing portion. The lower bonding working portion 27 has a top surface formed as a flat area larger than that of the semiconductor chip 90. The passage 31 is provided at the maximum vibration amplitude point f3 of the horn 24 and consists of a vertical hole 32 formed from the center of the top surface of the bonding working portion 27 to the center of the horn 24 through the inside of the bonding working portion 27 and a horizontal hole 33 formed from the center of the rear surface of the horn to the vertical hole 32 through the inside of the horn 24. The opening of the vertical hole 32 in the bonding working portion 27 is a suction hole for sucking the semiconductor chip 90. The opening of the horizontal hole 33 in the horn 24 is a hose nozzle for connecting a hose. A heater 34 is provided at the two minimum vibration amplitude points f2 and f4 of the horn 24. The maximum vibration amplitude points f1 and f5 are existent at the both ends of the horn 24.

With reference to FIG. 3, a connection structure for connecting a hose to the opening of the horizontal hole 33 which is a hose nozzle will be described. An air cylinder 38 and a non-contact type thermometer 39 such as an infrared thermometer are attached to a bracket 37 extending downward from the center in a horizontal direction of the holder 16. A hose joint 40 is fitted onto the piston rod of the air cylinder 38. A trumpet-form adsorption pad 41 made from a synthetic resin having elasticity is installed on the front surface of the hose joint 40. one end of a vacuum hose 43 made from rubber or synthetic resin is connected to the top surface of the hose joint 40. The other end of the suction hose 43 is connected to an unshown suction generator such as a vacuum pump by an unshown valve.

By the expansion of the air cylinder 38, the hose joint 40 moves forward, the adsorption pad 41 contacts the rear surface of the horn 24 around the opening of the horizontal hole 33, an opening at the end of the adsorption pad 41 transforms elastically and expands outward, and the inner hole portions of the passage 31 and the suction hose 43 are connected to each other through the inner hole of the hose joint 40 and the inner hole of the adsorption pad 41 (see FIG. 4). When the unshown valve is switched from an air opening side to a suction side in this state, the opening of the bonding working portion 27 sucks the air by the suction operation of the suction generator to adsorb the semiconductor chip 90.

Conversely, when the valve is switched from a suction side to an air opening side, the passage 31 is filled with the air to release the semiconductor chip 90. By the contraction of the air cylinder 38, the hose joint 40 moves backward, the adsorption pad 41 is separated from the rear surface of the horn 24 around the opening of the horizontal hole 33, and the passage 31 and the suction hose 43 are disconnected from each other. Right and left guide rods 44 extending from the rear surface of the hose joint 40 are fitted in guide holes 45 formed in the bracket 37 around the air cylinder 38 to prevent the rotation of the hose joint 40. Thus, the hose joint 40 move forward or backward.

As shown in FIG. 4, right and left heater stays 47 fitted with the heaters 34 independently are attached to a heater guide 496 fixed to the bracket 37 in such a manner the at they can move in a horizontal direction. while the e heaters 34 are inserted and fitted in heater holes 48 formed in the resonator 23, a bolt 49 is fastened to the heater guide 46 through the heater stay 47 so that the theater stay 47 is positioned and fixed to the heater guide 46.

Returning to FIG. 1, the measuring unit 60 is measuring means for aligning the chip side pads 91 of the semiconductor chip 90 adsorbed to the bonding working portion 27 of the ultrasonic vibration bonding unit 10 with the substrate side pads 93 of the circuit board 92 mounted on the mount table 4 and comprises a turn table 61 installed on the installation base 1, upper and lower measuring light sources 63 and 64 mounted on the movable arm 62 of the turn table 61, a double-field optical lens 65 mounted on the movable arm 62 and a CCD camera 70 mounted on the movable arm 62. The double-field optical lens 65 comprises two rectangular prisms 66 and 67 which are placed one upon the other with an optical film 68 interposed between the inclined surfaces of the prisms and one rectangular prism 65 having a reflection film 69 on a side opposite to the CCD camera 70.

The movable arm 62 is moved from a standby position shown by a solid line to a measuring position shown by a dotted line by the turn table 61 and stops at the measuring position, and the upper and lower measuring light sources 63 and 64 and the double-field optical lens 65 are inserted and arranged without contact between the semiconductor chip 90 and the circuit board 92 to be measured which are separated from each other in a vertical direction. In this state, one of the upper and lower measuring light sources 63 and 64, for example, the upper measuring light source 63 lights up, and the reflection of light irradiated from the measuring light source 63 onto the under surface of the semiconductor chip 90 is reflected by the optical film 68 of the double-field optical lens 65 toward the reflective film 69 and then reflected by the reflection film 69. This reflection transmits through the optical film 68 and reaches the CCD camera 70, whereby the CCD camera 70 picks up an image of the chip side pads 91 of the semiconductor chip 90, converts it into an electric signal and outputs it as an image signal. The other lower measuring light source 64 lights up, the reflection of light irradiated from the measuring light source 64 onto the top surface of the circuit board 92 is reflected by the optical film 68 of the double-field optical lens 65 toward the CCD camera 70. This reflection reaches the CCD camera 70 which in turn picks up an image of substrate side pads, converts it into an electric signal and outputs it.

That is, the measuring unit 60 turns on the upper and lower measuring light sources 63 and 64 alternately so that the CCD camera 70 can pick up an image of the chip side pads 91 and an image of the substrate side pads 93 alternately through the double-field optical lens 65. Alternatively, the measuring unit 60 turns on the upper and lower measuring light sources 63 and 64 simultaneously so that the CCD camera 70 can pick up images of the chip side pads 91 ad the substrate side pads 93 through the double-field optical lens 65 simultaneously. However, since the obtained image is such that an image of the chip side pads 91 and an image of the substrate side pads 93 are overlapped with each other in this case, an operator operates the XYθ drive unit 3 manually while looking at two combined images displayed on a monitor unit 80 and confirms that the semiconductor chip 90 is aligned with the chip mounting position of the circuit board 92 when the monitor unit 80 displays that the whole image of the chip side pads 91 is aligned with the whole image of the substrate side pads 93. Therefore, the measuring unit 60 is advantageously used for manual operation.

The arithmetic unit 71 of the measuring unit 60 computes the positions of the chip side pads 91 and the substrate side pads 93 and a difference between them from the image signals from the CCD camera 70 and outputs a control signal to the XYθ drive unit 3. According to a monitor display instruction input from the operator, the arithmetic unit 71 converts a signal from the CCD camera 70 into an image signal and outputs it to the monitor unit 80. The monitor unit 80 displays the image of the chip side pads 91, the image of the substrate side pads 93 and X-Y reference lines L1 and L2 which cross each other at center points P which the X and Y directions and θ direction of the XYθ drive unit 3 cross on two divided screens. As for the X-Y reference lines L1 and L2 which are displayed on the two divided screens of the monitor unit 80, when the two divided screens are arranged vertically, the Y reference lines L2 form a single vertical straight line and when the two divided screens are arranged horizontally, the X reference lines L1 form a single horizontal straight line. Thereby, the operator can easily check if the chip side pads 91 and the substrate side pads 93 are aligned or how much and which direction they are separated from each other by looking at the two divided screens of the monitor unit 80.

A description is subsequently given of the operation of Embodiment 1. The horn 24 of the ultrasonic vibration bonding unit 10 stops at the upward movement limit position as shown in FIG. 1, the semiconductor chip 90 is absorbed and adsorbed to the bonding working portion 27 of the horn 24, the chip side pads 91 of the semiconductor chip 90 face down, the circuit board 92 is mounted on the mount table 4 of the mounting unit 2, and the substrate side pads 93 of the circuit board 92 face up. In this state, the measuring unit 60 moves from a position shown by a solid line to a position shown by a dotted line, and the upper and lower measuring light sources 63 and 64 and the double-field optical lens 65 advance into the space between the semiconductor chip 90 and the circuit board 92 without contact. The upper and lower measuring light sources 63 and 64 light on alternately, whereby the CCD camera picks up an image of the chip side pads 91 and an image of the substrate side pads 93. Thereafter, the arithmetic unit 71 measures and computes the difference between the positions of the chip side pads 91 and the positions of the substrate side pads 93. According to the measurement result, the mount table 4 corrects the position of the circuit board 92 based on the semiconductor chip 90 by moving in the X, Y and θ directions so that the positions of the chip side pads 91 can be aligned with the positions of the substrate side pads 93 accurately. When the positions of the substrate side pads which are the mounting position of the circuit board 92 are aligned with the positions of the chip side pads 91 in a vertical direction by this correction, the measuring unit 60 moves from the position shown by the dotted line to the position shown by the solid line, and the upper and lower measuring light sources 63 and 64, the double-field optical lens 65 and the CCD camera 70 return to their original positions.

Thereafter, the resonator 23 of the ultrasonic vibration bonding unit 10 falls, presses the chip side pads 91 against the substrate side pads and applies pressure, and the transducer 30 generates ultrasonic vibration. The resonator 23 resonates with this ultrasonic vibration, ultrasonic vibration generated by this resonance acts on contact portions between the chip side pads 91 and the substrate side pads from the semiconductor chip, the chip side pads 91 and the substrate side pads are bonded together, and the semiconductor chip 90 is thereby mounted on the surface of the circuit board 92 at the chip mounting position. The semiconductor chip 90 is pressed against the circuit board 92 by the downward movement of the air cylinder 15 of the ultrasonic vibration bonding unit 10 and the downward movement of the bolt-nut unit 13 by the motor 12. The control of this pressure is carried out by the output of the air cylinder 15.

As for the control of the bonding time between the chip side pads 91 and the substrate side pads, the arithmetic unit 71 determines the bonding end time from information on the time elapsed from the start of the ultrasonic vibration of the transducer 30 and temperature information from the thermometer. When the bonding end time is reached, the arithmetic unit 71 instructs the transducer 30 to stop vibration, the valve of a pressure supply system to the air cylinder 15 to switch to a rising mode and the motor 12 to switch to a rising mode. Thereby, the resonator 23 rises and separates from the semiconductor chip 90 mounted on the surface of the circuit board 92 and reaches the upward movement limit position.

Figure 5:
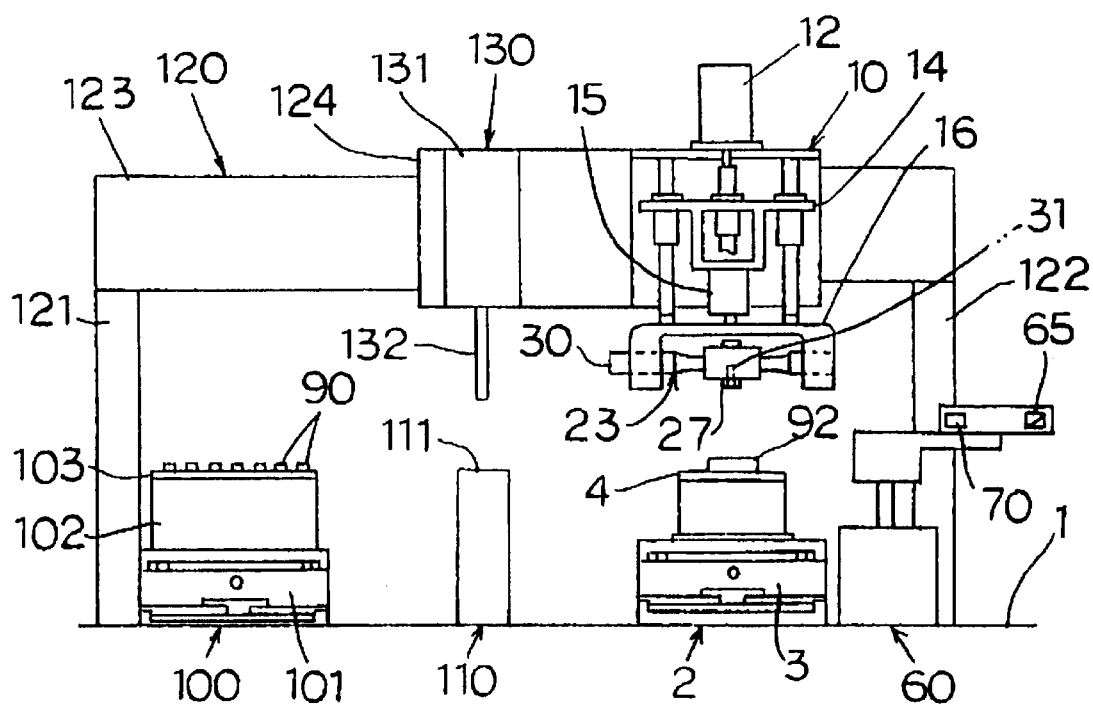
FIG. 5 is a side view of an ultrasonic vibration bonding machine according to Embodiment 2 of the present invention.

FIG. 5 shows an ultrasonic vibration bonding machine according to Embodiment 2 of the present invention. In FIG. 5, a chip supply unit 100, pre-alignment unit 110 and chip carrying unit 120 are arranged on the installation base 1 in parallel to the mounting unit 2 in addition to The mounting unit 2, ultrasonic vibration bonding unit 10, measuring unit 60 and unshown monitor unit.

The chip supply unit 100 has an XY drive unit 101 installed on the installation base 1 and a pallet table 102 connected to the XY drive unit 101. The XY drive unit 101 moves the pallet table 102 in X and Y directions which are the lengthwise and widthwise directions of a plane parallel to the installation base 1 to control the position of the pallet table 102 so that one semiconductor chip 90 to be mounted out of a large number of semiconductor chips 90 stored in a pallet 103 mounted on the pallet table 102 is situated at a predetermined picking position.

The pre-alignment unit 110 has a pre-alignment table 111 having an unshown uneven surface for roughly positioning the semiconductor chip 90 to be mounted on the top surface.

The chip carrying unit 120 has a horizontal rail 123 which is laid above the chip supply unit 100, the pre-alignment unit 110 and the mounting unit 2 by a plurality of columns 121 and 122 installed on the installation base 1 and a movable table 124 which is movably attached to the horizontal rail 123. An unshown actuator such as a motor controls the position of the movable table 124 in such a manner that it moves the movable table 124 between the left forward movement limit position and the right backward movement limit position. A picking unit 130 and the ultrasonic vibration bonding unit 10 are fitted onto the movable table 124 in parallel to each other at a predetermined interval.

This predetermined interval is such that when the movable table 124 stops at the right backward movement limit position, the end of the pick-up arm 132 of the picking unit 130 is positioned right above the pre-alignment position of the pre-alignment table 111 and the bonding working portion 27 of the resonator 23 is positioned right above the mounting position of the mount table 4 and when the movable table 124 stops at the left forward movement limit position, the end of the pick-up arm 132 of the picking unit 130 is positioned right above the picking position of the pallet table 102 and the bonding working portion 27 is positioned right above the pre-alignment position of the pre-alignment table 111.

The picking unit 130 has a base portion 131 installed on t he movable table 124 and the pick-up arm 132 extending downward from the base portion 131, and an unshown actuator incorporated in the base portion 131 moves the pick-up arm 132 to the upward movement limit position and the downward movement limit position. The downward movement limit position of this pick-up arm 132 is a controlled position where the end of the pick-up arm 132 can absorb or adsorb the semiconductor chip 90 on the pallet table 102 and the semiconductor chip 90 absorbed or adsorbed to the pick-up arm 132 can be mounted on the pre-alignment table 111. The use of a motor or air cylinder as the actuator is practical. In the case of a motor, the pick-up arm 132 is moved vertically through the bolt-nut unit and the guide unit in such a manner that it does not turn and in the case of an air cylinder, a buffer unit is preferably provided not to give an impact to the semiconductor chip 90.

The pick-up arm 132 of this embodiment has an absorbing and adsorbing portion. That is, the pick-up arm 132 is formed of a pipe and an unshown suction generator such as a vacuum pump is connected to the rear end of the pick-up arm 132 through an unshown valve. when this unshown valve is switched from an air opening side to a suction side, the pick-up arm 132 sucks the air from an opening at the end by the suction operation of the suction generator to absorb and adsorb the semiconductor chip 90. Conversely, when the valve is switched from the suction side to the air opening side, the inside of the pick-up arm 132 is filled with the air and the absorption and adsorption of the semiconductor chip 90 are canceled.

The ultrasonic vibration bonding unit 10 has the same structure as that of Embodiment 1 except that the fixed base 11 is installed on the movable table 124.

A description is subsequently given of the operation of Embodiment 2. In the first step, when the movable table 124 of the chip carrying unit 120 moves left from the backward movement limit position and stops at the forward movement limit position, the pick-up arm 132 falls, picks up the semiconductor chip 90 to be mounted from the pallet table 102 by suction and rises.

In the second step, when the movable table 124 moves right from the forward movement limit position and stops at the backward movement limit position, the pick-up arm 132 falls, places the semiconductor chip 90 on the pre-alignment table 111 and rises. When this semiconductor chip 90 is placed on the pre-alignment table 111, it is roughly positioned by the uneven surface of the pre-alignment table 111 or the like.

In the third step, when the movable table 124 moves left again and stops at the forward movement limit position, the horn 24 of the ultrasonic vibration bonding unit 10 falls, picks up the semiconductor chip 90 from the pre-alignment table 111 by suction and rises. Simultaneously with the picking-up of this semiconductor chip 90, the pick-up arm 132 falls, picks up the semiconductor chip 90 to be mounted next from the pallet table 102 by suction and rises (the same operation as in the first step).

In the fourth step, when the movable table 124 moves right again and stops at the backward movement limit p position, the measuring unit 60 measures the chip side pads 91 (see FIG. 1) of the semiconductor chip 90 adsorbed to the bonding working portion 27 and the substrate side pads 93 (see FIG. 1) of the circuit board 92 mounted on the mount table 4 of the mounting unit 2 and drives the mount table 4 in the X, Y and θ directions according to the measurement result so that the chip side pads 91 are aligned with the substrate side pads 93 accurately.

In the fifth step, the resonator 23 of the ultrasonic vibration bonding unit 10 falls and presses the semiconductor chip 90 against the circuit board 92 an d the transducer 30 generates ultrasonic vibration while the resonator 23 applies pressure. The resonator 23 resonates with this ultrasonic vibration, the chip side pads 91 are bonded to the substrate side pads 93 by ultrasonic vibration generated by this resonance, and the semiconductor chip 90 is thereby mounted on the surface of the circuit board 92. Along with the surface mounting of the semiconductor chip 90, the pick-up arm 132 falls, positions and mounts the semiconductor chip 90 to be mounted next on the pre-alignment table 111 and rises (the same operation as in the second step.

Thereafter, the semiconductor chips 90 to be mounted are roughly positioned on the pre-alignment table 11 from the pallet table 102, positioned accurately at the mounting position of the circuit board 92 which is changed each time on the mount table and mounted on the surface of the circuit board 92 one after another by repeating one cycle of the third step to the fifth step.

According to the constitution of Embodiment 2, since the picking unit 130 and the ultrasonic vibration bonding unit 10 are attached to the movable table 124 of the chip carrying unit 120 at a predetermined interval, when the movable table 124 stops at the backward movement limit position, the pick-up arm 132 can be positioned right above the pre-alignment position of the pre-alignment table 111 and the bonding working portion 27 can be positioned right above the mounting position of the mount table 4 and when the movable table 124 stops at the forward movement limit position, the pick-up arm 132 can be positioned right above the picking position of the pallet table 102 and the bonding working portion 27 can be positioned right above the pre-alignment position of the pre-alignment table 111.

As described above, according to the first aspect of the present invention, since the resonator has a passage for absorbing and adsorbing the second material at the maximum vibration amplitude point provided at the bonding working portion, the passage can be formed by combining the vertical hole extending from the lower surface of the bonding working portion through the inside of the resonator and the horizontal hole extending from the vertical hole to one surface of the resonator and can be made simple in structure.

According to the second aspect of the present invention, since the suction passage and the suction hose connected to the suction passage are made separate units which can be connected and disconnected, when the metal portions of the first material and the metal portions of the second material are to be bonded together by ultrasonic vibration, the suction hose is disconnected from the resonator and the resonance state of the resonator becomes proper.

According to the third aspect of the present invention, since the resonator has heaters at the minimum vibration amplitude points, the heaters do not resonate with the ultrasonic vibration of the resonator and achieve long service life.

What is claimed is:

1. An ultrasonic vibration bonding machine for bonding metal portions of a first material to metal portions of a second material by ultrasonic vibration, comprising:

a mounting unit having a mount table where the first material is mounted;

an ultrasonic vibration bonding unit located above the mounting unit and comprising a holder, a resonator supported by the holder and having a bonding working portion where the second material is absorbed and adsorbed and descending to bond the metal portions of the first material to the metal portions of the second material under pressure, and a transducer transmitting the ultrasonic vibration; and a measuring unit inserted between the first and second materials and measuring, without contact, positions of the metal portions provided on a top surface of the first material and positions of the metal portions provided on an under surface of the second material to drive the mounting unit so that the metal portions of the first material are aligned with the metal portions of the second material, wherein the resonator has a suction passage for absorbing and adsorbing the second material at a maximum vibration amplitude point where the bonding working portion is provided, the suction passage consists of a vertical passage and a horizontal passage, the vertical passage extends from an edge of the bonding working portion to a center of the resonator through an inside of the bonding working portion and the horizontal passage extends from a back face of the resonator through an inside of the resonator to the vertical passage to be communicated with the vertical passage, an opening of the vertical passage at the bonding working portion is an opening for absorbing the second material and an opening of the horizontal passage at the resonator is an opening for connecting a suction hose.

2. The ultrasonic vibration bonding machine according to claim 1, wherein the suction passage and a suction hose connected to the suction passage are made separate units which can be connected and disconnected.

3. The ultrasonic vibration bonding machine according to claim 1, wherein the ultrasonic vibration bonding unit further comprises at least one heater inserted in a heater hole provided at a minimum vibration amplitude point of the resonator, and a supporting means provided on the holder for supporting the heater.

* * * * *